US009663857B2

(12) United States Patent
Nakano et al.

(10) Patent No.: US 9,663,857 B2
(45) Date of Patent: May 30, 2017

(54) METHOD FOR STABILIZING REACTION CHAMBER PRESSURE

(71) Applicant: ASM IP Holding B.V., Almere (NL)

(72) Inventors: Ryu Nakano, Sagamihara (JP); Wataru Adachi, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 122 days.

(21) Appl. No.: 14/246,969

(22) Filed: Apr. 7, 2014

(65) Prior Publication Data
US 2015/0284848 A1 Oct. 8, 2015

(51) Int. Cl.
C23C 16/455 (2006.01)

(52) U.S. Cl.
CPC .. *C23C 16/45557* (2013.01); *C23C 16/45536* (2013.01); *C23C 16/45544* (2013.01); *C23C 16/45561* (2013.01); *Y10T 137/0396* (2015.04)

(58) Field of Classification Search
CPC ................ C23C 16/45548; C23C 16/45527
See application file for complete search history.

(56) References Cited

U.S. PATENT DOCUMENTS

| 6,911,092 B2 | 6/2005 | Sneh | |
|---|---|---|---|
| 2005/0120805 A1* | 6/2005 | Lane | C23C 16/45557 73/861 |
| 2006/0147626 A1* | 7/2006 | Blomberg | C23C 16/45527 427/248.1 |
| 2008/0264337 A1* | 10/2008 | Sano | C23C 16/4408 118/704 |
| 2010/0092696 A1* | 4/2010 | Shinriki | C23C 16/18 427/576 |
| 2010/0178423 A1* | 7/2010 | Shimizu | C23C 16/45544 427/248.1 |
| 2014/0033978 A1* | 2/2014 | Adachi | C23C 16/45542 118/696 |

* cited by examiner

*Primary Examiner* — Elizabeth Burkhart
(74) *Attorney, Agent, or Firm* — Snell & Wilmer LLP (57) ABSTRACT

A method stabilizes pressure of a reaction chamber during a process using a first gas and a second gas, wherein a gas inlet line is connected to the reaction chamber, and a second gas line and a first gas line are connected to another end of the gas inlet line. The method includes: feeding a first gas in pulses according to a waveform to the reaction chamber through the first gas line and the gas inlet line; and feeding a second gas in pulses according to a reverse waveform to the reaction chamber through the second gas line and the gas inlet line, wherein superimposed waveforms of the waveform and reverse waveform are made substantially or nearly flat, thereby stabilizing pressure of the reaction chamber.

6 Claims, 7 Drawing Sheets

METHOD FOR STABILIZING REACTION CHAMBER PRESSURE

BACKGROUND OF THE INVENTION

Field of the Invention

The present invention generally relates to a gas supply system for a reaction chamber, particularly to a method for stabilizing reaction chamber pressure when supplying a gas to the reaction chamber.

Description of the Related Art

Figure 1:
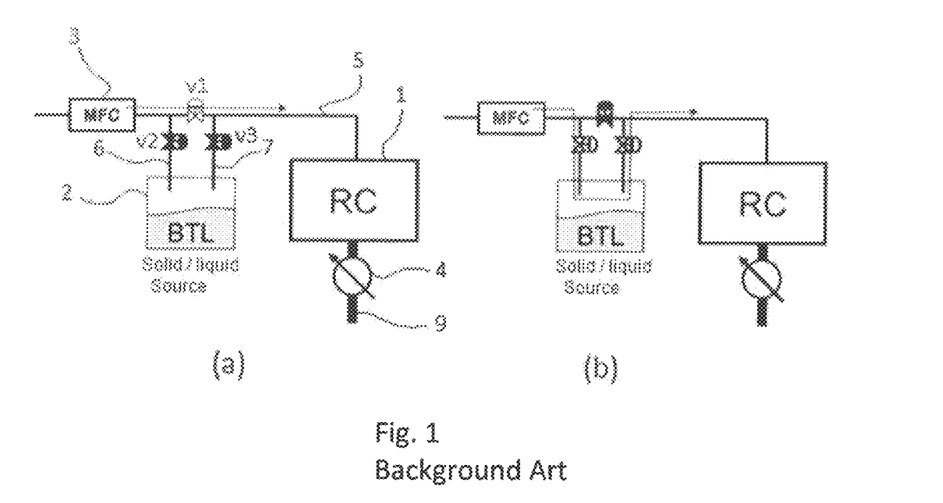
FIG. 1 illustrates schematic views of a gas supply system for supplying a source gas having a low vapor pressure to a reaction chamber according to background art, wherein a gas which does not include a vaporized source gas is supplied to the reaction chamber in (a), and a gas which includes a vaporized source gas is supplied to the reaction chamber in (b).

In an atomic layer deposition (ALD) process, controlling a flow rate and supply time of material constituting a source gas for forming a film is very important to achieve a good process result and good device stability. When a liquid material or a solid material having a relatively low vapor pressure at ambient temperature is used as source material, a desired vapor pressure can easily be obtained by heating a reservoir (or bottle) containing the material, and pressure fluctuation when supplying the material to a reaction chamber can be suppressed to a insignificant level. FIG. 1 illustrates schematic views of a gas supply system for supplying a source gas having a low vapor pressure to a reaction chamber (RC) 1 according to background art, wherein a gas which does not include a vaporized source gas is supplied to the reaction chamber 1 through a mass flow controller (MFC) 3 and valve v1 provided in a gas line 5 in (a), and a gas which includes a source gas vaporized in a bottle (BTL) 2 is supplied to the reaction chamber through the mass flow controller 3, valve v2 provided in an inlet line 6, the bottle 2, and valve v3 provided in an outlet line 7 in (b). In (a), valve v1 is open, and valve v2 and valve v3 are closed, whereas in (b), valve v1 is closed, whereas valve v2 and valve v3 are open. The pressure in the reaction chamber 1 is controlled during the process by a pressure control valve 4 provided in an exhaust line 9.

Figure 2:
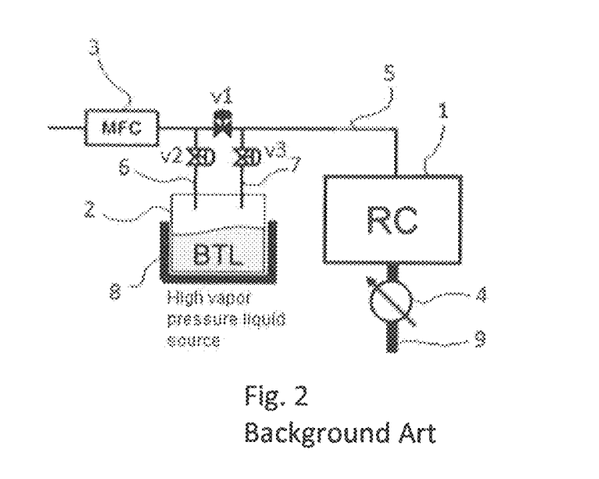
FIG. 2 illustrates a schematic view of a gas supply system for supplying a source gas having a high vapor pressure to a reaction chamber according to background art.

However, when a gas material or a liquid material having a high vapor pressure at ambient temperature is used, the material is oversupplied to a reaction chamber because the volume of the material is large. The oversupply of the material brings about adverse effects, e.g., lowered in-plane uniformity of material adsorption on a substrate surface, prolonged purge time to remove the material from the reaction chamber, pressure fluctuation in the reaction chamber, and increased amount of the material used. Therefore, in order to control the amount of supplied material, vapor pressure can be lowered by cooling the material reservoir. However, for that purpose, cooling equipment is installed, and complex hardware and control are required. FIG. 2 illustrates a schematic view of a gas supply system for supplying a source gas having a high vapor pressure to a reaction chamber 1 according to background art. This gas supply system in FIG. 2 is substantially similar to that illustrated in FIG. 1 wherein the same reference numbers indicate the same parts as in FIG. 1, except that a cooling jacket 8 is installed around the bottle 2 so that the material having a high vapor pressure does not generate excessive vapor.

Figure 3:
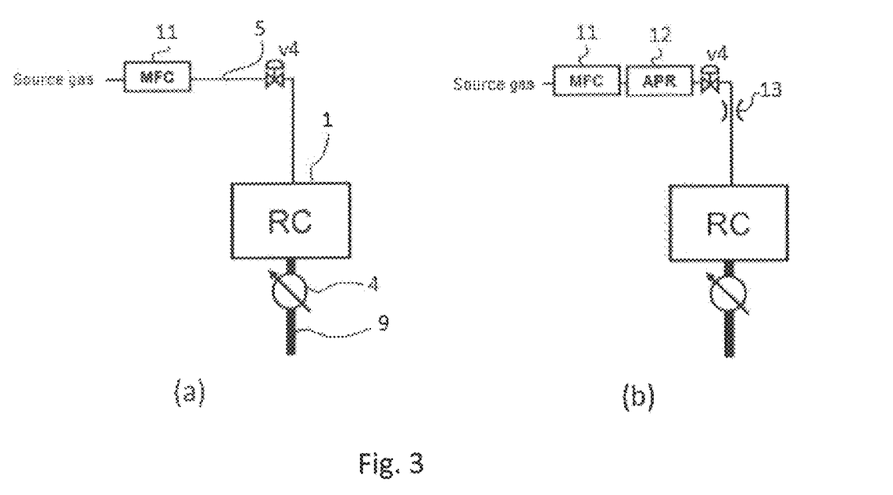
FIG. 3 illustrates schematic views of a gas supply system for supplying a source gas having a high vapor pressure to a reaction chamber according to modified background art, wherein a source gas is supplied to a reaction chamber via a mass flow controller (MFC) in (a), and a source gas is supplied to a reaction chamber via a MFC and an auto-pressure regulator (APR) in (b).

There are other approaches to handle a material having a high vapor pressure. FIG. 3 illustrates schematic views of a gas supply system for supplying a source gas having a high vapor pressure to a reaction chamber according to modified background art, wherein a source gas is supplied to a reaction chamber 1 via a mass flow controller (MFC) 11 through valve v4 provided in a gas line 5 in (a), and a source gas is supplied to a reaction chamber 1 via a MFC 11 and an auto-pressure regulator (APR) 12 through valve v4 and a throttle 13 in (b). In the above, the MFC 11 is installed downstream of the bottle 2 or is provided in a source gas supply line without a bottle where the material is gaseous at room temperature. Since the response speed of the MFC 11 is low, the configuration using the MFC 11 in (a) is insufficient for controlling an advanced ALD cycle, i.e., switching gases in a very short time period (e.g., 0.1 to 1.0 second). The configuration using the MFC 11 and the APR 12 is of a valve-switch-pulsing type wherein flow is controlled by opening and closing the valve in combination with the APR. Since the APR has higher response speed than the MFC, this configuration can be used for an ALD cycle. However, since the pressure in the reaction chamber is increased when the source gas is supplied thereto by operation of the valve and the APR, a large pressure fluctuation occurs as the gas supply starts and ends. The pressure control valve 4 then compensates for the increase of pressure in the reaction chamber by opening the pressure control valve 4. Since the operation of the pressure control valve 4 is not highly responsive and has a delay, the pressure in the reaction chamber is overcompensated. As a result, the risk of particle generation becomes high due to reverse blow from the exhaust line 9 or the like.

Figure 4:
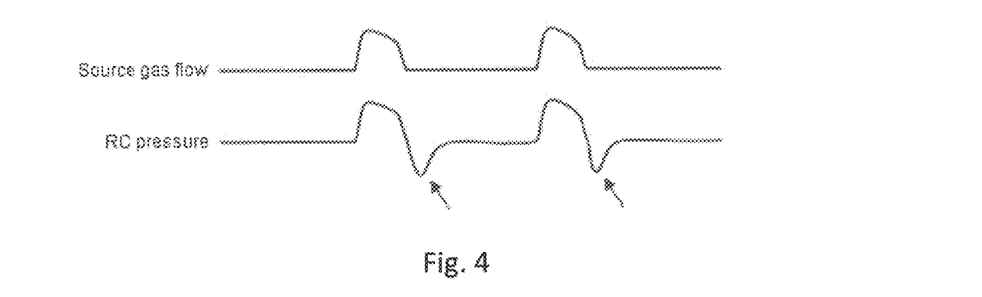
FIG. 4 illustrates charts showing changes in source gas flow in a reaction chamber and changes in reaction chamber pressure with time when the gas supply system illustrated in (b) in FIG. 3 is used.

FIG. 4 illustrates charts showing changes in source gas flow in the reaction chamber and changes in reaction chamber pressure with time when the gas supply system illustrated in (b) in FIG. 3 is used. The source gas flow is sharply or instantly increased and decreased as shown in FIG. 4. The pressure in the reaction chamber changes as the source gas flow changes as shown in FIG. 4. When the pressure in the reaction chamber increases, the pressure control valve installed downstream of the reaction chamber responds to the pressure increase and starts reducing the pressure by opening the valve so as to maintain the constant pressure in the reaction chamber. However, when the pressure starts lowering due to the operation of the pressure control valve, the source gas flow is stopped, and as a result, the pressure in the reaction chamber is overcompensated and becomes too low due to the response delay. This phenomenon is illustrated in FIG. 4 and marked with an arrow. This type of pressure hunting is not avoidable for systems changing supply gas flow while maintaining the pressure in a reaction chamber.

Any discussion of problems and solutions involved in the related art has been included in this disclosure solely for the purposes of providing a context for the present invention, and should not be taken as an admission that any or all of the discussion were known at the time the invention was made. For example, FIGS. 1-4 (FIGS. 1 and 2 are designated by a legend "Background Art") illustrate the background of the invention for the present inventors and should not be considered to represent prior art known at the time the invention was made.

SUMMARY OF THE INVENTION

To resolve at least one of the above problems, some embodiments provide a gas supply system comprising a mechanism for supplying a source gas containing chemicals having a high vapor pressure and an inert gas, the flow of which inert gas compensates for fluctuation of the source gas flow so that the total flow of the source gas and the inert gas in the reaction chamber can always be constant during the process, wherein one of the source gas or the inert gas is supplied to a reaction chamber, while the other of the source gas or the inert gas is supplied to an exhaust line downstream of the reaction chamber, thereby suppressing pressure fluctuation in the reaction container. However, in the above embodiments, since one of the source gas or the inert gas is always supplied or discarded to the exhaust line, this mechanism is not cost effective. In the above, the source gas and the inert gas can be any type of gas, and thus may also be referred to as a "first gas" and "second gas", respectively.

As a method for resolving the above disadvantage, some embodiments provide a gas supply system comprising a mechanism for supplying a source gas to a reaction chamber in pulses rapidly or instantaneously starting and ending by operation of a valve and a mechanism for supplying an inert gas to the reaction chamber, the flow of which inert gas compensates for fluctuation of the source gas flow so that the total flow of the source gas and the inert gas in the reaction chamber can always be constant during the process, wherein when the source gas is supplied to the reaction chamber, the inert gas is supplied to an exhaust line downstream of the reaction chamber, and when no source gas is supplied, the inert gas is supplied to the reaction chamber, thereby suppressing pressure fluctuation in the reaction container. In the above embodiments, since the source gas is not supplied or discarded to the exhaust line, this mechanism is more cost effective than the first described mechanism.

Further, as an alternative method to resolve the pressure fluctuation problem, some embodiments provides a gas supply system comprising a mechanism for supplying a source gas to a reaction chamber in pulses rapidly or instantaneously starting and ending by operation of a valve and a mechanism for supplying an inert gas to the reaction chamber in reverse pulses rapidly or instantaneously ending and starting by dynamic pressure control so as to compensate for fluctuation of the source gas flow so that the total flow of the source gas and the inert gas in the reaction chamber can always be constant during the process, thereby more effectively suppressing pressure fluctuation in the reaction container than in the first and second described mechanisms.

The disclosed embodiments can be applied to an apparatus containing one or more reaction chambers. According to the disclosed embodiments, chemicals having a high vapor pressure can stably be supplied to a reaction chamber using inexpensive hardware.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead may be comprised of, consist essentially of, or consist of a source gas and a additive gas. The source gas is a gas supplying elements constituting a target film on a substrate and may be referred to as a precursor. The additive gas includes a gas for oxidizing and/or nitriding the precursor when RF power is applied to the additive gas. The precursor and the additive gas can be introduced as as mixed gas or separately to a reaction space. The precursor can be introduced with a carrier gas or dilution gas such as a rare gas. A gas other than the process gas, i.e., a gas introduced without passing through the showerhead, may be used for, e.g., sealing the reaction space, which includes a seal gas such as a rare gas. Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc, in some embodiments.

In this disclosure, any defined meanings do not necessarily exclude ordinary and customary meanings in some embodiments, in the present disclosure where conditions and/or structures are not specified, the skilled artisan in the art can readily provide such conditions and/or structures, in view of the present disclosure, as a matter of routine experimentation, in all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

The embodiments will be explained with respect to preferred embodiments. However, the present invention is not limited to the preferred embodiments.

An embodiment of the present invention provides a method for stabilizing pressure of a reaction chamber during a process using a first gas (e.g., source gas) and a second gas (e.g., inert gas), wherein a gas inlet line is connected to the reaction chamber, and a second gas line and a first gas line are connected to another end of the gas inlet line, said method comprising: (i) feeding a first gas in pulses according to a waveform to the reaction chamber through the first gas line and the gas inlet line; and (ii) feeding a second gas in pulses according to a reverse waveform to the reaction chamber through the second gas line and the gas inlet line, wherein superimposed waveforms of the waveform and reverse waveform are made substantially flat, thereby stabilizing, pressure of the reaction chamber during the process even if the first gas has a high vapor pressure. Hereinafter, the disclosed embodiments are explained with respect to a source gas as the first gas, and an inert gas as the second gas. However, the embodiments are not intended to be limited to the source gas and the inert, gas.

In the disclosure, regarding a "waveform," "substantially flat" or the like may refer to an immaterial fluctuation, less than a detectable fluctuation, a fluctuation that does not materially affect the target or intended properties, or a fluctuation recognized by a skilled artisan as nearly flat, such that the difference is less than 20%, less than 10%, less than 5%, less than 1%, or any ranges thereof relative to a comparative or referenced fluctuation in some embodiments. The term "substantially constant", "substantially similar", or the like can also be interpreted in the same manner. In some embodiments, the fluctuation which is considered to be substantially flat refers to a difference between the maximum pressure and minimum pressure during the process which is less than 200 Pa, 100 Pa, 50 Pa, 10 Pa, 3, Pa, or 1 Pa. The "waveform" is a representation of the shape of a wave that indicates amplitude of flow rate along the axis of time. The "reverse" waveform refers to a waveform having a wave shape which is generally or substantially opposite to that of a reference waveform along the axis of time.

In some embodiments, the source gas line has a main line and a branch line branched off from the main line upstream of the other end of the gas inlet line, the inert gas line has a main line and a branch line branched off from the main line upstream of the other end of the gas inlet line, and the branch line of the source gas line and the branch line of the inert gas line are connected to a vent line for discharging gas by bypassing the reaction chamber, wherein the waveform is formed by switching the main line and the branch line of the source gas whereas the reverse waveform is formed by switching the main line and the branch line of the inert gas. By using the vent, both the source gas and the inert gas can continuously and constantly be supplied to the respective main lines, and by synchronizing switching of the main line and the branch line of the source gas and switching of the main line and the branch line of the inert gas, the superimposed waveforms of the waveform and reverse waveform can be made substantially flat.

In some embodiments, mass flow in the source gas line is regulated by a mass flow controller upstream of the branching point, mass flow in the inert gas line is regulated by a mass flow controller upstream of the branching point, and flow in the vent line is controlled by a throttle. By using the throttle provided in the vent line, the switching of the main line and the branch line of the source gas and the switching of the main line and the branch line of the inert gas can be conducted smoothly, without significant fluctuations of flow rate.

In some embodiments, the inert as line has a main line and a branch line branched off from the main line upstream of the other end of the gas inlet line, said branch line of the inert gas line being a vent line for discharging gas by bypassing the reaction chamber, wherein the waveform is formed by opening and closing the source gas line whereas the reverse waveform is formed by switching the main line and the branch line of the inert gas. In the above embodiments, the switching of the main line and the branch line is conducted only for the inert gas.

In some embodiments, flow pressure in the source gas line is regulated by an auto pressure regulator, and further, flow in the source gas line is controlled by a throttle downstream of the auto pressure regulator, whereas mass flow in the inert gas line is regulated by a mass flow controller upstream of the branching point, and flow in the branch line is controlled by a throttle. A combination of the auto pressure regulator and the throttle can rapidly and responsively start and stop the source gas flow without a branch line. The mass flow controller controls mass flow on the secondary side, and is typically for controlling mass flow at a set constant rate on the secondary side. Thus, the mass flow controller has low responding rate and is slow in responding to any flow changes occurring in the downstream. In contrast, the auto pressure regulator controls the pressure on the secondary side at the set value, and is more responsive to any pressure changes in the downstream than is the mass flow controller.

In some embodiments, flow pressure in the source gas line is regulated by an auto pressure regulator, and further, flow in the source gas line is controlled by a throttle downstream of the auto pressure regulator, whereas flow pressure in the inert gas line is regulated by, an auto pressure regulator, wherein the waveform and the reverse waveform are formed by opening and closing the source gas line between the auto pressure regulator and the throttle. In the above embodiments, no branch lines are used, and two auto pressure regulators are used to control the source gas and the inert gas, and a combination of the auto pressure regulator and the throttle is used for the source gas line. In some embodiments, flow in the gas inlet line is further controlled by a throttle. In some embodiments, a throttle metering of the throttle in the gas inlet line is greater than a throttle metering of the throttle the source gas line.

In some embodiments, the target process performed in the reaction chamber is a cyclic film-forming process, particularly semiconductor processing. When performing a cyclic film-forming process, gases are repeatedly switched, and thus, pressure in the reaction chamber significantly fluctuates. However, according to the disclosed embodiments, the pressure fluctuation can significantly be suppressed during the process, in some embodiments, the cyclic process includes cyclic CVD, plasma-enhanced atomic layer deposition (ALD), thermal ALD, radical enhanced ALD, or any other cyclic thin film deposition methods. Alternatively, in other embodiments, the process includes plasma-enhanced CVD, thermal CVD, or any other thin film deposition methods.

In some embodiments, the chemicals constituting the source gas are liquid or gas at room temperature, and have a high vapor pressure. The term "high vapor pressure" refers to a vapor pressure of about over 1 kPa at 0° C., typically over 5 kPa at 0° C. In the embodiments, even if the volume of the source gas is increased, pressure fluctuation can effectively be suppressed during the cyclic process. For example, the chemicals constituting the source gas include silane, trisilylamine, and hexane, which can be used singly or in any combination. Alternatively, in other embodiments, the chemicals constituting the source gas have a low vapor pressure and are solid or liquid at room temperature. As for the inert gas, (bis(diehylamino)silane) and tetraethoxysilane can be used singly or in any combination.

The disclosed embodiments are further explained below with reference to the drawings. However, the drawings are not intended to limit the present invention. A skilled artisan will appreciate that the apparatus includes one or more controller(s) (not shown) programmed or otherwise configured to cause deposition and reactor cleaning processes, etc. to be conducted. The controller(s) are communicated with the various power sources, heating systems, pumps, robotics and gas flow controllers or valves of the reactor, as will be appreciated by the skilled artisan.

Figure 5:
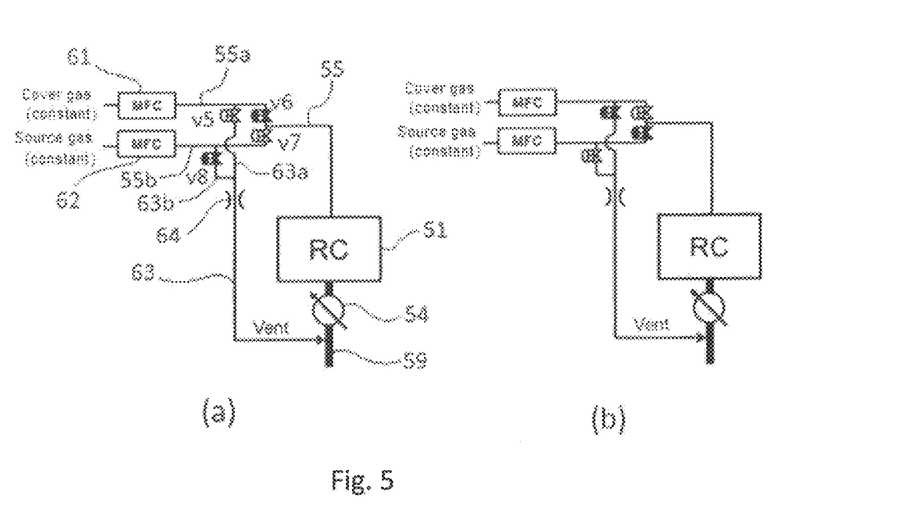
FIG. 5 illustrates schematic views of a gas supply system for supplying a source gas to a reaction chamber according to an embodiment of the present invention, wherein a source gas is supplied to the reaction chamber while an inert gas is supplied to an exhaust line in (a), and the source gas is supplied to the exhaust line while the inert gas is supplied to the reaction chamber in (b).

FIG. 5 illustrates schematic views of a gas supply system for supplying a source gas to a reaction chamber according to an embodiment of the present invention, wherein a source gas is supplied to the reaction chamber while a cover gas is supplied to an exhaust line in (a), and the source gas is supplied to the exhaust line while the cover gas is supplied to the reaction chamber in (b). In this system, a gas inlet line 55 is connected to a reaction chamber 51, and an inert gas line 55a and a source gas line 55b are connected to another end of the gas inlet line 55. The source gas line 55b has a main line 55b and a branch line 63b branched off from the main line 55b upstream of the other end of the gas inlet line 55, the inert gas line 55a has a main line 55a and a branch line 63a branched off from the main line 55a upstream of the other end of the gas inlet line 55, and the branch line 63b of the source gas line and the branch line 63a of the inert gas line are connected to a vent line 63 for discharging gas by bypassing the reaction chamber 51. Mass flow in the source gas line 55b is regulated by a mass flow controller (MFC) 62 upstream of the branching point (the point where the branch line 63b meets the main line 55b), mass flow in the inert gas line 55a is regulated by a mass flow controller (MFC) 61 upstream of the branching point (a point where the branch line 63a meets the main line 55a), and flow in the vent line 63 is controlled by a throttle 64 (which can be an orifice, a needle valve, or the like). A pressure control valve 54 is provided in an exhaust line 59 downstream of the reaction chamber 51 so that the pressure in the reaction chamber 51 is controlled by operation of the pressure control valve 54. The main line 55a and the branch line 63a of the inert gas line are provided with valve v6 and valve v5, respectively. The main line 55b and the branch line 63b of the source gas line are provided with valve v7 and valve v8, respectively.

In this configuration, first, valve v1 and valve v7 are closed whereas valve v6 and valve v8 are open, wherein an inert gas is fed to the reaction chamber 51 through the MFC 61, the inert gas line (the main line) 55a, and the gas inlet line 55 via valve v6, while a source gas is diverted to the exhaust line 59 through the MFC 62, the source gas line 55b, the branch line 63b, and the vent line 63 via valve v8 and the throttle 64 as illustrated in (b) in FIG. 5. Next, while maintaining constant flow rates of the inert gas and the source gas, valve 6 and valve 8 are closed whereas valve v1 and valve v7 are open in an instant and synchronizing manner, wherein the inert gas is diverted to the exhaust line 59 through the MFC 61, the inert gas line 55a, the branch line 63a, and the vent line 63 via valve v5 and the throttle 64, while the source gas is fed to the reaction chamber 51 through the MFC 62, the source gas line 55b, and the gas inlet line 55 via valve v7 as illustrated in (a) in FIG. 5. The states illustrated in (b) and (a) are repeated alternately so that the source gas is fed to the reaction chamber in pulses while the inert gas is fed to the reaction chamber in reverse pulses which are reverse to the source gas pulses. Since the total flow of the source gas and the inert gas in the reaction chamber is constant, the pressure in the reaction chamber is also constant so that the pressure control valve 54 does not cause pressure fluctuation. In this disclosure, the inert gas may also be referred to as "cover gas" whose flow compensates for fluctuation of flow of the source gas. The source gas may be a mixture of vaporized chemicals which are solid or liquid at room temperature and a carrier gas, or a gaseous chemicals which are gas at room temperature with or without a dilution or carrier gas.

The throttle 64 is provided in the vent line 63 so as to more accurately control the mass flow regulated by the MFC 61. If there is a difference in pressure between the exhaust line and the vent line, when switching the states illustrated in (b) and (a) in FIG. 5, the pressure on the secondary side of the MFC is changed, and thus, it is difficult to maintain the constant mass flow outputted from the MFC. That is, more pressure loss occurs in the path passing through the reaction chamber in the state illustrated in (b) than in the path passing through the vent line in the state illustrated in (a), and thus, the opening of the MFC tends to be wider in the state illustrated in (b) than in the state illustrated in (a). In order to alleviate the above problem, the throttle is provided in the vent line which has less pressure loss than the exhaust line immediately downstream of the reaction chamber, so that the pressure loss in the vent line and that in the exhaust line immediately downstream of the reaction chamber are matched, thereby regulating the mass flow from the MFC at a constant value when switching the states illustrated in (b) and (a) in FIG. 5.

Figure 6:
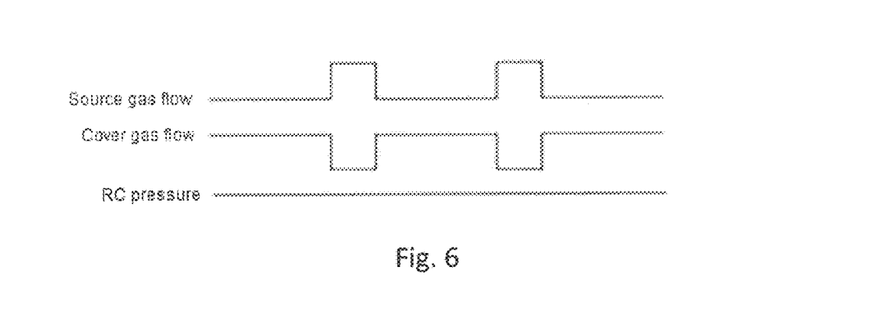
FIG. 6 illustrates charts showing changes in source gas flow and inert gas flow in a reaction chamber, and changes in reaction chamber pressure with time when the gas supply system illustrated in FIG. 5 is used.

FIG. 6 illustrates charts showing changes in source gas flow and cover gas flow in the reaction chamber, and changes in reaction chamber pressure with time. The source gas is fed to the reaction chamber in pulses according to the waveform as illustrated in FIG. 6, whereas the cover gas is fed to the reaction chamber in reverse pulses according to the reverse waveform as illustrated in FIG. 6, wherein superimposed waveforms of the waveform and reverse waveform are made substantially flat, thereby stabilizing pressure of the reaction chamber at a substantially constant value as illustrated in FIG. 6. The waveform is formed by switching the main line 55b and the branch line 63b of the source gas whereas the reverse waveform is formed by switching the main line 55a and the branch line 63a of the inert gas.

Figure 7:
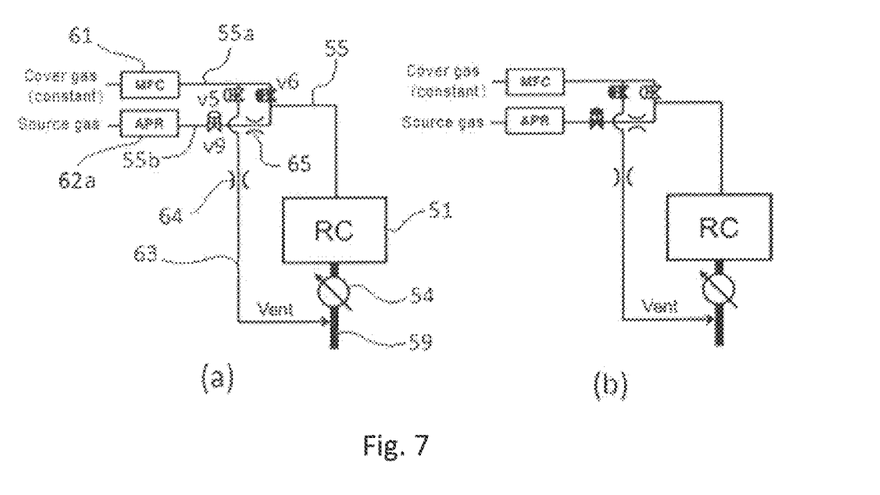
FIG. 7 illustrates schematic views of a gas supply system for supplying a source gas to a reaction chamber according to another embodiment of the present invention, wherein a source gas is supplied to the reaction chamber while an inert gas is supplied to an exhaust line in (a), and no source gas is supplied while the inert gas is supplied to the reaction chamber in (b).

FIG. 7 illustrates schematic views of a as supply system for supplying a source gas to a reaction chamber according to another embodiment of the present invention, wherein a source gas is supplied to the reaction chamber while a cover gas is supplied to an exhaust line in (a), and no source gas is supplied while the cover gas is supplied to the reaction chamber in (b). In this system, the inert gas line has a main line 55a and a branch line 63 branched off from the main line 55a upstream of the other end of the gas inlet line 55, said branch line 63 of the inert gas line being a vent line for discharging gas by bypassing the reaction chamber 51, whereas the source gas line 55b is not connected to the vent line 63. Flow pressure in the source gas line 55b is regulated by an auto pressure regulator (APR) 62a, and further, flow in the source gas line 55b is controlled by valve v9 and a throttle 65 downstream of the auto pressure regulator 62a, whereas mass flow in the inert gas line 55a is regulated by the mass flow controller (MFC) 61 upstream of the branching point (the point where the branch line 63 meets the main line 55a), and flow in the branch line 63 is controlled by the throttle 64.

In this configuration, first, valve v5 and valve v9 are closed whereas valve v6 is open, wherein an inert gas is fed to the reaction chamber 51 through the MFC 61, the inert gas line (the main line) 55a, and the gas inlet line 55 via valve v6, while a source gas is not supplied as illustrated in (b) in FIG. 7. Next, while maintaining a constant flow rate of the inert gas, valve 6 is closed whereas valve v8 and valve v9 are open in an instant and synchronizing manner, wherein the inert gas is diverted to the exhaust line 59 through the MFC 61, the inert gas line 55a, the branch line (vent line) 63 via valve v8 and the throttle 64, while the source gas is fed to the reaction chamber 51 through the APR 62a, the source gas line 55b, and the gas inlet line 55 via valve v9 and the throttle 65 as illustrated in (a) in FIG. 7. The states illustrated in (b) and (a) are repeated alternately so that the source gas is fed to the reaction chamber in pulses while the inert gas is fed to the reaction chamber in reverse pulses which are reverse to the source gas pulses. Since the total flow of the source gas and the inert gas in the reaction chamber is constant, the pressure in the reaction chamber is also constant so that the pressure control valve 54 does not cause pressure fluctuation.

The throttle 65 is provided in the source gas line 55b downstream of valve v9 the APR 62a. If the secondary side of the APR has insufficient pressure loss, the APR may not be able to increase the pressure on the secondary side, and the inflow amount of the source gas entering the APR increases. In order to alleviate the above problem, the throttle 65 is provided in the source gas line 55b so as to increase controllability of the APR.

Figure 8:
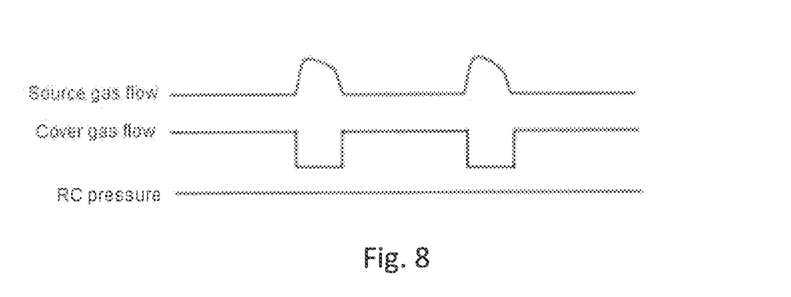
FIG. 8 illustrates charts showing changes in source gas flow and inert gas flow in a reaction chamber, and changes in reaction chamber pressure with time when the gas supply system illustrated in FIG. 7 is used.

FIG. 8 illustrates charts showing changes in source gas flow and cover gas flow in the reaction chamber, and changes in reaction chamber pressure with time. The source gas is fed to the reaction chamber in pulses according to the waveform as illustrated in FIG. 8, whereas the cover gas is fed to the reaction chamber in reverse pulses according to the reverse waveform as illustrated in FIG. 8, wherein superimposed waveforms of the waveform and reverse waveform are made substantially flat, thereby stabilizing pressure of the reaction chamber at a substantially constant value as illustrated in FIG. 8. The waveform is formed by opening and closing the source gas line 55b whereas the reverse waveform is formed by switching the main line 55a and the branch line 63 of the inert gas. In FIG. 8, the pulses in the waveform of the source gas flow do not completely mirror, but is substantially similar to, the reverse pulses in the reverse waveform of the cover gas flow. If the waveforms are substantially similar to each other, the total gas flow in the reaction chamber can be stabilized, and sudden pressure changes therein can effectively be avoided, inhibiting generation of particles. When using an APR, a switch valve, and a throttle arranged in a gas line in this order toward a reaction chamber as in FIG. 7, a pulse of gas flow can start and be stabilized in about 0.1 seconds, depending on the size of the throttle, the pressure on the primary side of the APR, the responsibility of the APR, etc.

Figure 9:
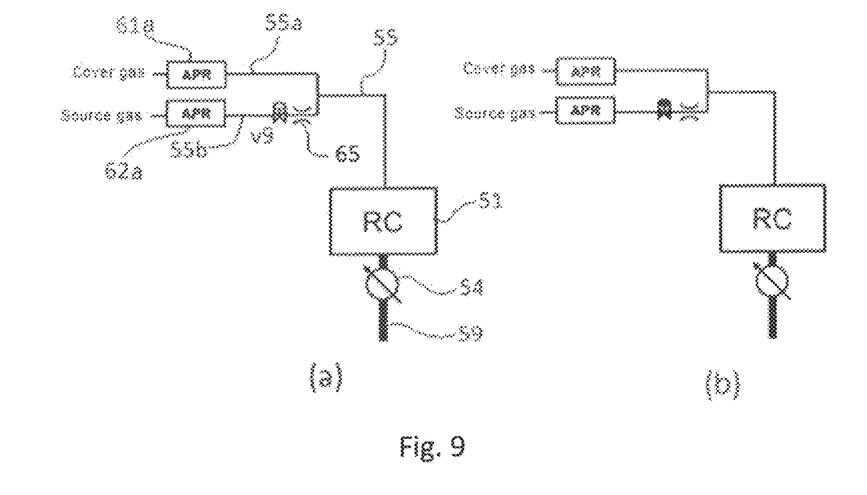
FIG. 9 illustrates schematic views of a gas supply system for supplying a source gas to a reaction chamber according to still another embodiment of the present invention, wherein a source gas is supplied to the reaction chamber while an inert gas is also supplied to the reaction chamber in (a), and no source gas is supplied while the inert gas is supplied at an increased flow rate to the reaction chamber in (b).

FIG. 9 illustrates schematic views of a gas supply system for supplying a source gas to a reaction chamber according to still another embodiment of the present invention, wherein a source gas is supplied to the reaction chamber while a cover gas is also supplied to the reaction chamber in (a), and no source gas is supplied while the cover gas is supplied at an increased flow rate to the reaction chamber in (b). In this system, no vent line is provided. The inert gas line has a main line 55a connected to the other end of the gas inlet line 55. Flow pressure in the source gas line 55b is regulated by an auto pressure regulator (APR) 62a, and further, flow in the source gas line 55b is controlled by valve v9 and a throttle 65 downstream of the auto pressure regulator 62a, whereas mass flow in the inert gas line 55a is regulated by an auto pressure regulator (APR) 61a, and no valve is provided in the inert gas line 55a or the gas inlet line 55.

In this configuration, first, valve v9 is closed, wherein an inert gas is fed to the reaction chamber 51 through the APR 61a, the inert gas line 55a, and the gas inlet line 55, while no source gas is supplied as illustrated in (b) in FIG. 9. Next, valve 9 is open, and the APR 61a reduces the outflow in response to the increase in pressure in the gas inlet line 55, in an instant and synchronizing manner, wherein the source gas is fed to the reaction chamber 51 through the APR 62a, the source gas line 55b, and the gas inlet line 55 via valve v9 while the inert gas is also fed to the reaction chamber 51 at a reduced flow rate as illustrated in (a) in FIG. 9. The states illustrated in (b) and (a) are repeated alternately so that the source gas is fed to the reaction chamber in pulses while the inert gas is fed to the reaction chamber in reverse pulses which are reverse to the source gas pulses. Since the total flow of the source gas and the inert gas in the reaction chamber is constant, the pressure in the reaction chamber is also constant so that the pressure control valve 54 does not cause pressure fluctuation.

Figure 10:
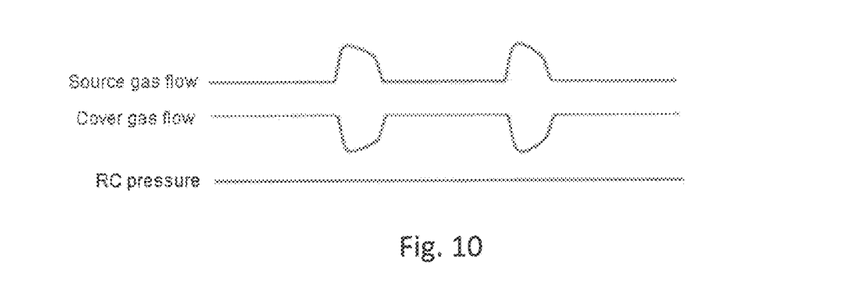
FIG. 10 illustrates charts showing changes in source gas flow and inert gas flow in a reaction chamber, and changes in reaction chamber pressure with time when the gas supply system illustrated in FIG. 9 is used.

FIG. 10 illustrates charts showing changes in source gas flow and cover gas flow in the reaction chamber, and changes in reaction chamber pressure with time. The source gas is fed to the reaction chamber in pulses according to the waveform as illustrated in FIG. 10, whereas the cover gas is continuously fed to the reaction chamber in reverse pulses according to the reverse waveform as illustrated in FIG. 10, wherein superimposed waveforms of the waveform and reverse waveform are made substantially flat, thereby stabilizing pressure of the reaction chamber at a substantially constant value as illustrated in FIG. 10. The waveform and the reverse waveform are formed by opening and closing valve v9 in the source gas line 55b between the auto pressure regulator 62a and the throttle 65. In FIG. 10, as with FIGS. 6 and 8, the pulses in the waveform of the source gas flow do not completely mirror, but are substantially similar to, the reverse pulses in the reverse waveform of the cover gas flow. When using a first APR, a switch valve, and a throttle arranged in a first gas line in this order toward a reaction chamber as in FIG. 9, a pulse of first gas flow can start and be stabilized in about 0.1 seconds, and also, when using a second APR arranged in a second gas line in parallel to the first APR as in FIG. 9, the second APR can adjust the outflow of the second gas, in a synchronizing manner, to maintain the total downstream pressure of the first and second gases in response to the pulses of the first gas flow.

Figure 11:
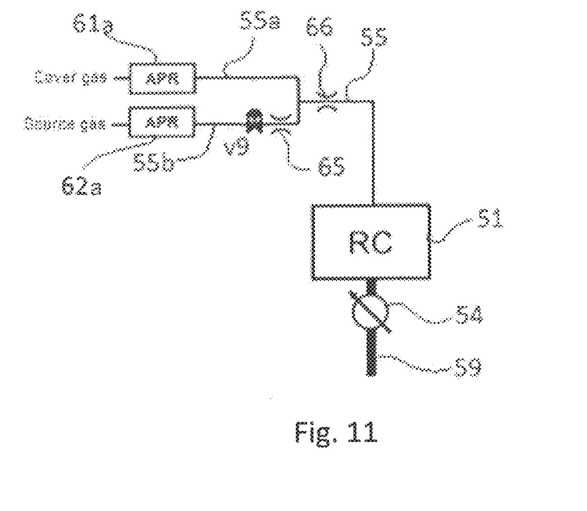
FIG. 11 illustrates a schematic view of a gas supply system for supplying a source gas to a reaction chamber according to yet another embodiment of the present invention.

FIG. 11 illustrates a schematic view of a gas supply system for supplying a source gas to a reaction chamber according to yet another embodiment of the present invention. This configuration is the same as that illustrated in FIG. 9 except that a throttle 66 is provided in the gas inlet line 55. The throttle 66 is provided in the gas inlet line 55 downstream of the merging point where the inert gas line 55a and the source gas line 55b meet. If pressure loss downstream of the secondary side of the APR 61a is insufficient, the APR may not be able to increase the pressure on the secondary side, and the amount of the source gas passing through the APR increases. In order to alleviate the above problem, the throttle 66 is provided in the gas inlet line 55 so as to increase controllability of the APR 61a. However, if the throttle metering of the throttle 66 is too small, the flow of the inert gas becomes too low, prolonging purge time for purging the source gas front the reaction chamber. Thus, in some embodiments, the throttle metering of the throttle 66 in the gas inlet line 55 is greater than the throttle metering of the throttle 65 in the source gas line 55b.

EXAMPLE 1

Figure 12:
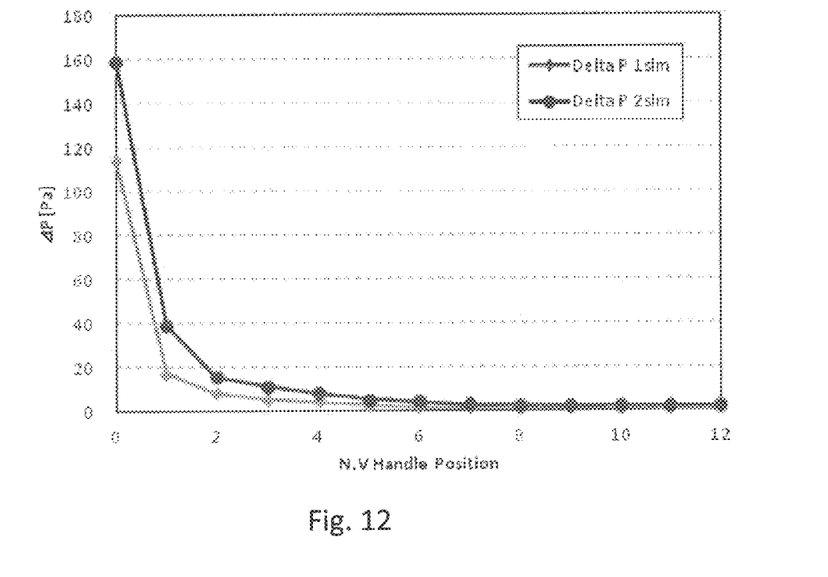
FIG. 12 is a graph showing reaction chamber pressure fluctuation ($\Delta P$ [Pa]) in relation to handle position of a needle valve in the gas supply system illustrated in FIG. 5.
Figure 13:
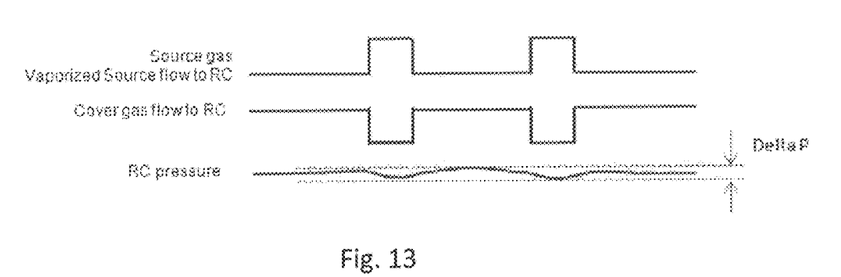
FIG. 13 illustrates charts showing changes in source gas flow and inert gas flow in a reaction chamber, and changes in reaction chamber pressure with time when the gas supply system illustrated in FIG. 5 was used in Example 1.

A dummy recipe was created for a PEALD apparatus illustrated in FIG. 5 and conducted under conditions where the pressure of the reaction chamber was controlled at 500 Pa, a source gas was $SiH_4$, the duration of a pulse of supplying the source gas to the reaction chamber was 0.2 seconds, a cover gas was Ar, the duration of a pulse of supplying the cover gas to the reaction chamber was 2.0 seconds, the flow rate (FR) of the source gas and that of the cover gas were the same and set as shown in Table 1 below, and the handle position of a needle valve provided in the vent line (throttle 64 in FIG. 5) was set as shown in Table 1 below. 20 cycles were conducted for each set of the conditions by repeating the state illustrated in (b) in FIG. 5 and the state illustrated in (a) in FIG. 5 alternately while adjusting the pulses of the source gas and the cover gas as illustrated in FIG. 13. The pressure fluctuation in the reaction chamber was defined to be a difference between the maximum pressure and the minimum, pressure and was measured during the process as Delta P ($\Delta P$ [Pa]) as illustrated in FIG. 13. The results are shown in Table 1 and FIG. 12. In the table, "CV" is known as a flow coefficient indicating approximate flow through the valve, and can be calculated based on applied pressure ($CV = F(SG/dP)^{1/2}$ where F=flow rate [US gallons per minute], SG-specific gravity of fluid [1 for water], dP=pressure drop across valve [psi]).

TABLE 1

| Needle Valve Handle Position | CV [−] | Delta P [Pa] FR = 1 slm | Delta P [Pa] FR = 2 slm |
|---|---|---|---|
| 0 | 0.000 | 114.3 | 158.9 |
| 1 | 0.005 | 17.5 | 39.3 |
| 2 | 0.025 | 8.3 | 15.8 |
| 3 | 0.048 | 5.5 | 11.4 |
| 4 | 0.070 | 4.5 | 8.5 |
| 5 | 0.090 | 2.6 | 5.2 |
| 6 | 0.115 | 1.8 | 4.2 |
| 7 | 0.135 | 1.5 | 3.0 |
| 8 | 0.155 | 1.4 | 2.7 |
| 9 | 0.170 | 1.2 | 2.3 |
| 10 | 0.188 | 1.2 | 2.3 |
| 11 | 0.205 | 1.0 | 2.3 |
| 12 | 0.218 | 1.0 | 2.3 |

As shown in Table 1 and FIG. 12, when the flow through the vent line was zero, the pressure fluctuation in the reaction chamber was significant ($\Delta P=114.3$ Pa for 1 slm, $\Delta P=158.9$ Pa for 2 slm at a set reaction chamber pressure of 500 Pa). When the flow through the vent line was increased, the pressure fluctuation in the reaction chamber was effectively suppressed, especially when a CV value was 0.025 or higher ($\Delta P=8.3$ Pa or less for 1 slm, $\Delta P=15.8$ Pa or less for 2 slm), indicating that substantially no pressure fluctuation occurred during the process. However, if no needle valve was provided in the vent line, due to the difference in pressure between the vent line side (low pressure loss) and the reaction chamber side (high pressure loss), the flow entering the reaction chamber fluctuated.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for stabilizing pressure of a reaction chamber during a process using a first gas and a second gas, wherein a gas inlet line is connected to the reaction chamber, and a second gas line and a first gas line are connected to another end of the gas inlet line, said method comprising:

feeding a first gas in pulses according to a waveform to the reaction chamber through the first gas line and the gas inlet line; and feeding a second gas in pulses according to a reverse waveform to the reaction chamber through the second gas line and the gas inlet line, wherein superimposed waveforms of the waveform and reverse waveform are made substantially flat, thereby stabilizing pressure of the reaction chamber, wherein the first gas line has a main line and a branch line branched off from the main line upstream of the other end of the gas inlet line, the second gas line has a main line and a branch line branched off from the main line upstream of the other end of the gas inlet line wherein the main line of the first gas and the main line of the second gas are merged to the other end of the gas inlet line, and the branch line of the first gas line and the branch line of the second gas line are merged to a vent line for discharging gas by bypassing the reaction chamber, wherein the waveform is formed by switching the main line and the branch line of the first gas by using a valve provided in the branch line of the first gas between the branching point in the first gas line and the merging point in the vent line and a valve provided in the main line of the first gas between the branching point in the first gas line and the merging point with the second gas line in a vicinity of the merging point with the second gas line, whereas the reverse waveform is formed by switching the main line and the branch line of the second gas by using a valve provided in the branch line of the second gas between the branching point in the second gas line and the merging point in the vent line and a valve provided in the main line of the second gas between the branching point in the second gas line and the merging point with the first gas line in a vicinity of the merging point with the first gas line, wherein mass flow in the first gas line is regulated by a mass flow controller upstream of the branching point, mass flow in the second gas line is regulated by a mass flow controller upstream of the branching point, and flow in the vent line is controlled by a fixed throttle downstream of the merging point, wherein the first gas continuously flows through the mass flow controller for the first gas, and the second gas continuously flows through the mass flow controller for the second gas without mixing the first and second gases in the gas inlet line and the vent line.

2. The method according to claim 1, wherein the process is a cyclic film-forming process.

3. The method according to claim 2, wherein the process is atomic layer deposition (ALD).

4. The method according to claim 1, wherein the first gas is a source gas, and the second gas is an inert gas.

5. The method according to claim 4, wherein the chemicals constituting the source gas are liquid or gas at room temperature, and the inert gas is a rare gas.

6. A method for stabilizing pressure of a reaction chamber during a process using a first gas and a second gas, wherein a gas inlet line is connected to the reaction chamber, and a second gas line and a first gas line are connected to another end of the gas inlet line, said method comprising:

feeding a first gas in pulses according to a waveform to the reaction chamber through the first gas line and the gas inlet line; and feeding a second gas in pulses according to a reverse waveform to the reaction chamber through the second gas line and the gas inlet line, wherein superimposed waveforms of the waveform and reverse waveform are made substantially flat, thereby stabilizing pressure of the reaction chamber, wherein the second gas line has a main line and a branch line branched off from the main line upstream of the other end of the gas inlet line, said branch line of the second gas line being a vent line for discharging gas by bypassing the reaction chamber, whereas the first gas line is not connected to the vent line, wherein the waveform is formed by opening and closing the first gas line, whereas the reverse waveform is formed by switching the main line and the branch line of the second gas by using a valve provided in the branch line of the second gas between the branching point in the second gas line and a fixed throttle in the vent line and a valve provided in the main line of the second gas between the branching point in the second gas line and the merging point with the first gas line in a vicinity of the merging point with the first gas line, wherein flow pressure in the first gas line is regulated by an auto pressure regulator, and further, flow in the first gas line is controlled by a fixed throttle provided in the first gas line downstream of the auto pressure regulator in a vicinity of the merging point with the second gas line wherein a valve is provided in the first gas line between the auto pressure regulator and the fixed throttle wherein the first gas line is continuous from the auto pressure regulator to the fixed throttle, whereas mass flow in the second gas line is regulated by a mass flow controller upstream of the branching point, and flow in the branch line is controlled by the fixed throttle in the vent line, wherein the second gas continuously flows through the mass flow controller for the second gas without mixing the first and second gases in the gas inlet line.

* * * * *